(12) United States Patent
Bang et al.

(10) Patent No.: US 11,362,043 B2
(45) Date of Patent: Jun. 14, 2022

(54) MEMORY PACKAGE INCLUDING A MEMORY CHIP AND A MEMORY CONTROLLER

(71) Applicant: SK hynix Inc., Icheon-si (KR)

(72) Inventors: Byung Jun Bang, Icheon-si (KR); Sun Kyu Kong, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/934,771

(22) Filed: Jul. 21, 2020

(65) Prior Publication Data

US 2021/0335723 A1 Oct. 28, 2021

(30) Foreign Application Priority Data

Apr. 27, 2020 (KR) ........................ 10-2020-0050620

(51) Int. Cl.
*H01L 23/552* (2006.01)
*H01L 23/00* (2006.01)

(52) U.S. Cl.
CPC ............ *H01L 23/552* (2013.01); *H01L 24/45* (2013.01); *H01L 2924/1434* (2013.01); *H01L 2924/19041* (2013.01); *H01L 2924/19042* (2013.01)

(58) Field of Classification Search
CPC ...................................................... H01L 23/66
See application file for complete search history.

(56) References Cited

U.S. PATENT DOCUMENTS

| 2012/0314511 A1* | 12/2012 | Ishikawa | ................. H01L 22/34 365/189.05 |
| 2018/0061806 A1* | 3/2018 | Jung | ....................... H01L 24/16 |
| 2020/0105814 A1* | 4/2020 | Hashiguchi | ......... H01L 21/3205 |

FOREIGN PATENT DOCUMENTS

WO 2018063262 A1 4/2018

* cited by examiner

*Primary Examiner* — Yu-Hsi D Sun
(74) *Attorney, Agent, or Firm* — William Park & Associates Ltd.

(57) ABSTRACT

A memory package includes a package substrate including power wiring and ground wiring. The memory package also includes a memory controller disposed over an upper surface of the package substrate and electrically connected to the power wiring and the ground wiring. The memory package further includes a memory chip disposed over the memory controller and electrically connected to the power wiring and the ground wiring. The memory package additionally includes a band pass filter disposed at one side of the memory controller over the upper surface of the package substrate and including an inductor and a capacitor which are connected in series. The inductor and the capacitor connected in series are electrically connected between the power wiring and the ground wiring.

16 Claims, 9 Drawing Sheets

MEMORY PACKAGE INCLUDING A MEMORY CHIP AND A MEMORY CONTROLLER

CROSS-REFERENCE TO RELATED APPLICATION

This application claims priority under 35 U.S.C. § 119 to Korean Patent Application No. 10-2020-0050620 filed on Apr. 27, 2020, which is incorporated herein by reference in its entirety.

BACKGROUND

1. Technical Field

This patent document relates to a memory package, and more particularly, to a memory package including a memory chip and a memory controller.

2. Related Art

Electromagnetic interference refers to a phenomenon in which a high-frequency noise generated from an electronic circuit or system affects adjacent circuits, systems, or a human body. One method of blocking or attenuating the electromagnetic interference phenomenon is blocking or attenuating power noise.

SUMMARY

In an embodiment, a memory package may include: a package substrate including power wiring and ground wiring; a memory controller disposed over an upper surface of the package substrate and electrically connected to the power wiring and the ground wiring; a memory chip disposed over the memory controller and electrically connected to the power wiring and the ground wiring; and a band pass filter disposed at one side of the memory controller over the upper surface of the package substrate and including an inductor and a capacitor which are connected in series, wherein one of one electrode of the inductor and one electrode of the capacitor is electrically connected to the power wiring, and an other of the one electrode of the inductor and the one electrode of the capacitor is electrically connected to the ground wiring.

In another embodiment, a memory package may include: a package substrate including power wiring and ground wiring; a memory controller disposed over an upper surface of the package substrate and electrically connected to the power wiring and the ground wiring; a memory chip disposed over the memory controller and electrically connected to the power wiring and the ground wiring; and a band pass filter disposed at one side of the memory controller over the upper surface of the package substrate and including an inductor and a capacitor which are connected in series. The inductor and the capacitor connected in series are electrically connected between the power wiring and the ground wiring.

DETAILED DESCRIPTION

Hereinafter, various embodiments of the disclosure are described in detail with reference to the accompanying drawings.

The drawings might not be necessarily to scale, and in some instances, proportions of at least some structures appearing in the drawings may have been exaggerated in order to clearly illustrate certain features of the described embodiments or implementations. In presenting a specific embodiments in a drawing or description having two or more layers in a multi-layer structure, the relative positioning relationship of such layers or the sequence of arranging the layers as shown reflects a particular implementation for the described or illustrated embodiment and a different relative positioning relationship or sequence of arranging the layers may be possible. In addition, a described or illustrated embodiment of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Figure 1:
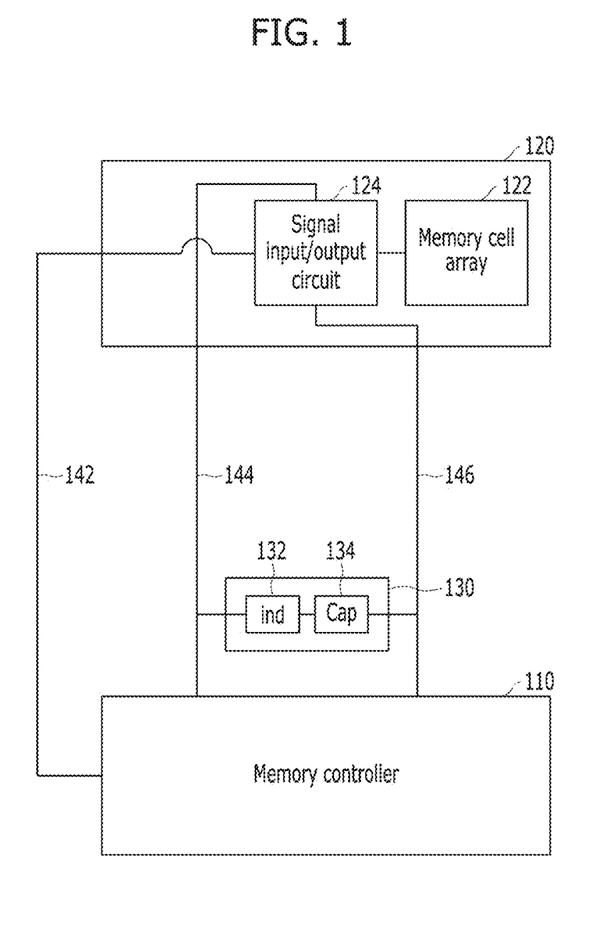
FIG. 1 is a circuit diagram illustrating a circuit corresponding to a memory package according to an embodiment of the present disclosure.

FIG. 1 is a circuit diagram illustrating a circuit corresponding to a memory package according to an embodiment of the present disclosure.

Referring to FIG. 1, the memory package may include a memory chip 120, a memory controller 110 electrically connected to the memory chip 120 and controlling the memory chip 120, and a band pass filter 130 connected to an electrical connection path between the memory chip 120 and the memory controller 110.

The memory chip 120 may include a memory cell array 122 and a signal input/output circuit 124. The memory cell array 122 may store data. The signal input/output circuit 124 may transmit signals, such as data, between the memory controller 110 and the memory cell array 122.

The memory cell array 122 may function to store data corresponding to a data signal transmitted from the signal input/output circuit 124. The memory cell array 122 may include non-volatile memory. For example, the memory cell array 122 may include NAND memory. However, the present disclosure is not limited thereto. The memory cell array 122 may include non-volatile memory, such as phasechange random-access memory (PRAM), magneto-resistive random-access memory (MRAM), and the like. The memory cell array 122 may include volatile memory, such as dynamic random-access memory (DRAM), static random-access memory (SRAM), and the like. The memory cell array 122 may also include a combination of volatile and non-volatile memory.

The signal input/output circuit 124 may be connected to a signal path 142 that electrically connects the memory controller 110 and the signal input/output circuit 124. The signal input/output circuit 124 may receive a signal from the memory controller 110 or output a signal to the memory controller 110. Also, the signal input/output circuit 124 may be connected between a power path 144 and a ground path 146 to receive a power voltage such as VCCQ and a ground voltage such as VSSM. The signal input/output circuit 124 may operate using these voltages.

The memory controller 110 and the memory chip 120 may TO share the power voltage and ground voltage. For this reason, the memory controller 110 may be also connected between the power path 144 and the ground path 146, and receive a power voltage and a ground voltage, which are equal to the power voltage and the ground voltage supplied to the memory chip 120, respectively, from an outside. The memory controller 110 may operate using these voltages.

The power supplied during the operation of the memory controller 110 and the signal input/output circuit 124 may be preferably in a static state. However, in actual operations, power noise may be generated, and such noise may generate a high impedance in an operating frequency band and a harmonic frequency band of the memory controller 110 and/or the signal input/output circuit 124. This impedance may induce charges to accumulate in conducting wires, and thus electromagnetic waves are emitted. This may cause problems such as electromagnetic interference. Therefore, the impedance may be lowered by blocking the power noise in a specific frequency band. In this embodiment, to satisfy this requirement, the band pass filter 130 may be additionally connected between the power path 144 and the ground path 146.

The band pass filter 130 may mean a filter that selectively passes only a frequency of a specific band and blocks/attenuates the rest. The band pass filter 130 may include an inductor 132 and a capacitor 134 connected in series. In other words, the band pass filter 130 may be an LC filter. The inductor 132 may have a characteristic of suppressing a high frequency, and the capacitor 134 may have a characteristic of passing the high frequency. Accordingly, when the inductor 132 and the capacitor 134 are connected in series, a frequency can be selectively passed or blocked. As a result, it may be possible to block/attenuate the power noise in a specific frequency band, thereby shielding EMI. In the present disclosure, one end of the inductor 132 is connected to the power path 144 and one end of the capacitor 134 is connected to the ground path 146. However, the positions of the inductor 132 and the capacitor 134 may be reversed.

Meanwhile, in the band pass filter 130 of the present embodiment, the capacitor 134 may also function as a decoupling capacitor for preventing insufficient power supply generated during the operation of the memory controller 110. For this reason, the capacitor 134 and the band pass filter 130 including the same may be placed adjacent to the memory controller 110. For example, the capacitor 134 and the band pass filter 130 including the same may be disposed closer to the memory controller 110 than the memory chip 120 in each of the power path 144 and the ground path 146.

According to the above-described circuit, the band pass filter 130 may have an effect of shielding EMI by blocking/attenuating the noise of the power supplied during the operation of the memory chip 120 and the memory controller 110.

In addition, the capacitor 134 included in the band pass filter 130 may be used to prevent a power shortage generated during the operation of the memory controller 110.

Further, the power noise may adversely affect the signal transmission between the memory chip 120 and the memory controller 110. When the power noise is blocked/attenuated as described above, the integrity of the signals transmitted between the memory chip 120 and the memory controller 110 may be secured.

Hereinafter, a memory package in which the circuit of FIG. 1 is implemented will be described with reference to FIGS. 2 to 5.

Figure 2:
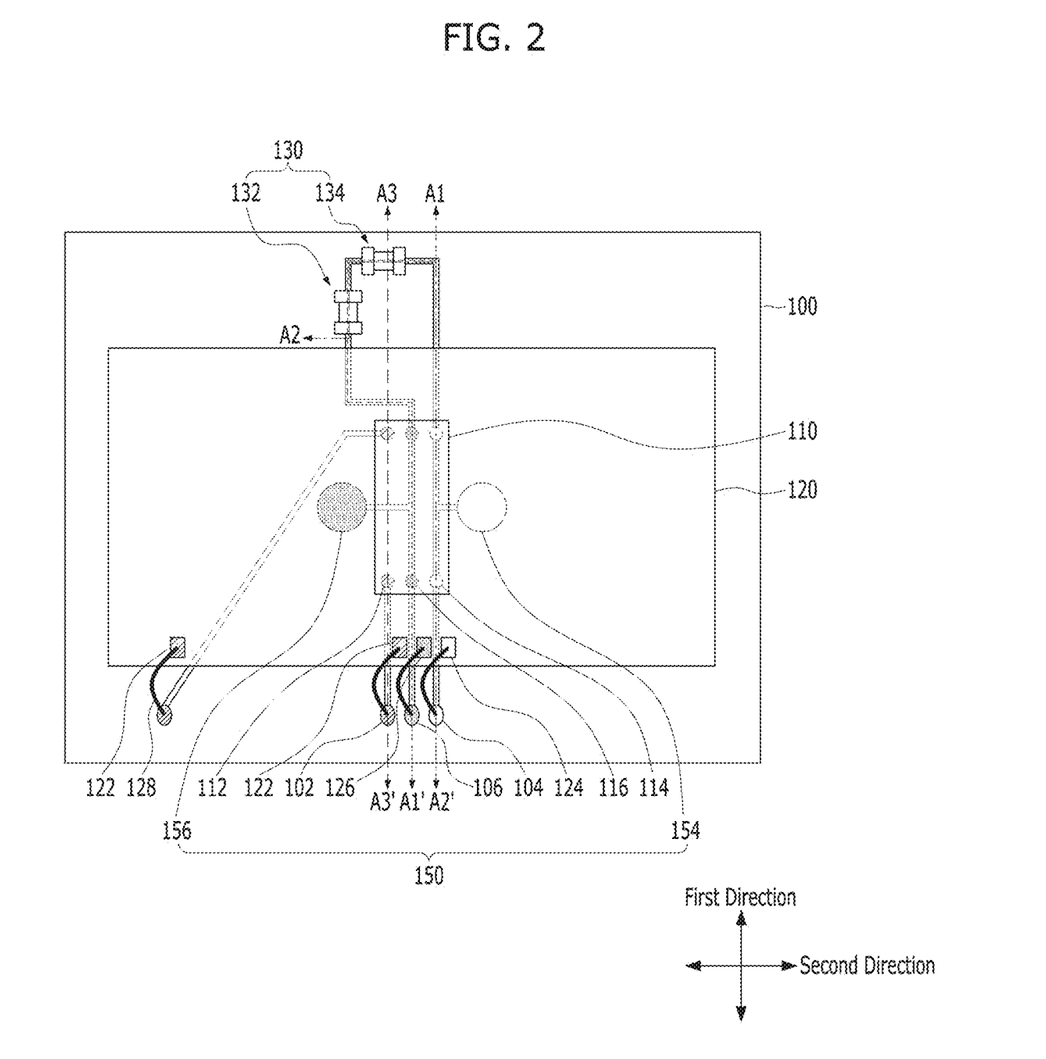
FIG. 2 is a plan view illustrating a memory package according to an embodiment of the present disclosure.
Figure 3:
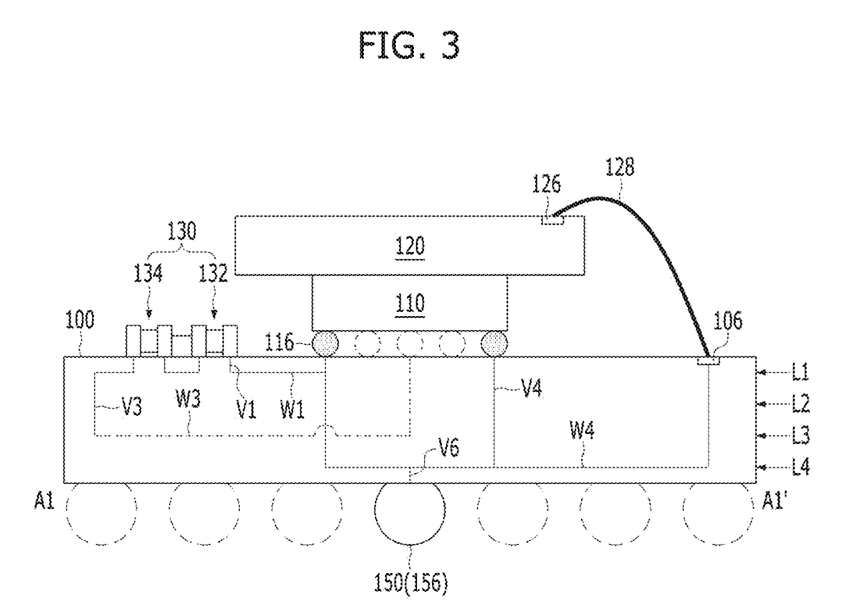
FIG. 3 is a cross-sectional view taken along a line A1-A1' of FIG. 2.
Figure 4:
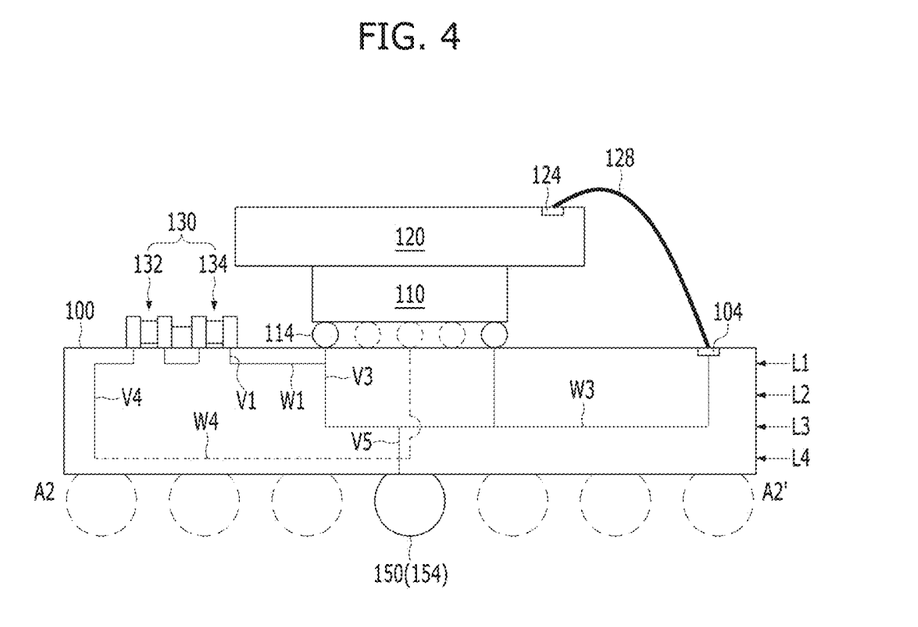
FIG. 4 is a cross-sectional view taken along a line A2-A2' of FIG. 2.
Figure 5:
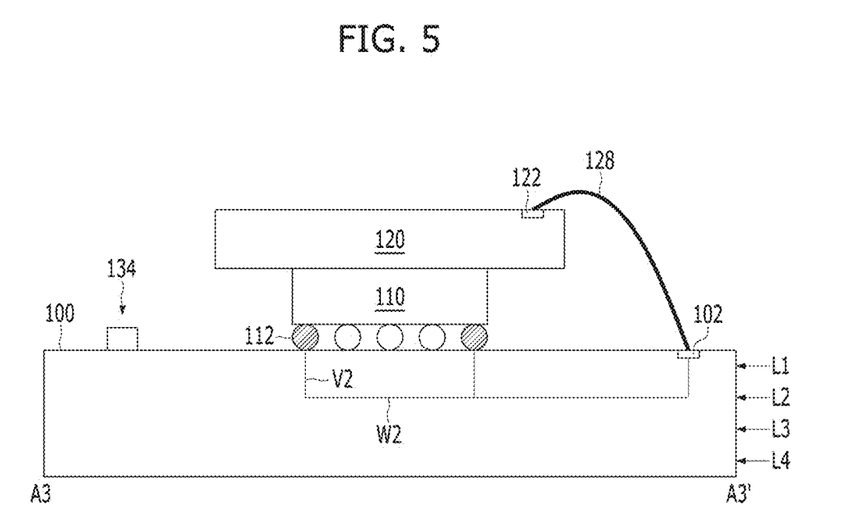
FIG. 5 is a cross-sectional view taken along a line A3-A3' of FIG. 2.

FIG. 2 is a plan view illustrating a memory package according to an embodiment of the present disclosure, FIG. 3 is a cross-sectional view taken along a line A1-A1' of FIG. 2, FIG. 4 is a cross-sectional view taken along a line A2-A2' of FIG. 2, and FIG. 5 is a cross-sectional view taken along a line A3-A3' of FIG. 2.

Referring to FIGS. 2 to 5, the memory package may include a package substrate 100, a memory controller 110 and a band pass filter 130 formed over an upper surface of the package substrate 100, a memory chip 120 formed over the memory controller 110, and an external connection terminal 150 formed over a lower surface of the package substrate 100.

The package substrate 100 may have a multilayer wiring structure for transmitting electrical signals. As an example, the package substrate 100 may be a printed circuit board (PCB). The multilayer wiring structure of the package substrate 100 will be described in detail after the memory controller 110, the memory chip 120, and the band pass filter 130 are first described.

The memory controller 110 may be disposed over the upper surface of the package substrate 100. The memory controller 110 may include a plurality of connection terminals 112, 114, and 116 for connecting to the package substrate 100 and receiving power or signals from the package substrate 100. Among the plurality of connection terminals 112, 114, and 116, a terminal to which a signal is applied will be referred to as a signal terminal 112, a terminal to which a power voltage is applied will be referred to as a power terminal 114, and a terminal to which a ground voltage is applied will be referred to as a ground terminal 116. In this embodiment, the connection terminals 112, 114, and 116 may be conductive bumps formed over a lower surface of the memory controller 110, which faces the package substrate 100. In addition, in this embodiment, the signal terminal 112, the ground terminal 116, and the power terminal 114 may be arranged at each of both side edges of the memory controller 110 in a first direction, while being arranged in a line along a second direction. However, the present disclosure is not limited thereto, and the shape, number, and arrangement of the connection terminals 112, 114, and 116 may be variously modified.

The memory chip 120 may be disposed over the memory controller 110. The memory chip 120 may be directly attached to an upper surface of the memory controller 110. Alternatively, the memory chip 120 may be attached to the upper surface of the memory controller 110 using an adhesive material (not shown). In this embodiment, the memory chip 120 may have a larger planar area than the memory controller 110. Also, the memory chip 120 may be disposed such that a center of the memory chip 120 overlaps the memory controller 110. However, the present disclosure is not limited thereto, and the planar area of the memory chip 120 or the overlapping portion with the memory controller 110 may be variously modified as long as the memory chip 120 is disposed over and overlaps the memory controller 110.

A plurality of chip pads 122, 124, and 126 may be disposed over an upper surface of the memory chip 120. The chip pads 122, 124, and 126 may be electrically connected to the package substrate 100 and receive power or a signal from the package substrate 100. Among the plurality of chip pads 122, 124, and 126, a chip pad to which a signal is applied will be referred to as a signal chip pad 122, a chip pad to which a power voltage is applied will be referred to as a power chip pad 124, and a chip pad to which a ground voltage is applied will be referred to as a ground chip pad 126. In this embodiment, the chip pads 122, 124, and 126 may be arranged in a line at one edge of the memory chip 120 in the first direction. As an example, two signal chip pads 122, one ground chip pad 126, and one power chip pad 124 are shown. However, the present disclosure is not limited thereto, and the number, arrangement, and the like of the chip pads 122, 124, and 126 may be variously modified.

The chip pads 122, 124, and 126 may be electrically connected to a portion of the package substrate 100, for example, a plurality of bonding pads 102, 104, and 106 disposed over the upper surface of the package substrate 100, through bonding wires 128. Among the plurality of bonding pads 102, 104, and 106, a bonding pad to which a signal is applied will be referred to as a signal bonding pad 102, a bonding pad to which a power voltage is applied will be referred to as a power bonding pad 104, and a bonding pad to which a ground voltage is applied will be referred to as a ground bonding pad 106. In this embodiment, the bonding pads 102, 104, and 106 may correspond to the chip pads 122, 124, and 126, respectively. The bonding pads 102, 104, and 106 may be arranged in a line at one edge of the package substrate 100 in the first direction. As an example, two signal bonding pads 102, one ground bonding pad 106, and one power bonding pad 104 are shown. However, the present disclosure is not limited thereto, and the number, arrangement, and the like of the bonding pads 102, 104, and 106 may be variously modified.

The bonding wire 128 may have both ends connected to the signal chip pad 122 and the signal bonding pad 102 corresponding thereto, respectively, and electrically connect them. In addition, the bonding wire 128 may have both ends connected to the power chip pad 124 and the power bonding pad 104 corresponding thereto, respectively, and electrically connect them. In addition, the bonding wire 128 may have both ends connected to the ground chip pad 126 and the ground bonding pad 106 corresponding thereto, respectively, and electrically connect them.

Meanwhile, in order to easily connect the chip pads 122, 124, and 126 and the bonding pads 102, 104, and 106 using the bonding wire 128, the memory chip 120 may be preferably disposed to expose the bonding pads 102, 104, and 106 disposed at the one edge of the package substrate 100 in the first direction. As an example, the memory chip 120 may have a smaller planar area than the package substrate 100 and be disposed to overlap a center of the package substrate 100.

The band pass filter 130 may include an inductor 132 and a capacitor 134. The inductor 132 and the capacitor 134 may be disposed over the upper surface of the package substrate 100. One of both electrodes of the inductor 132 and one of both electrodes of the capacitor 134 may be connected to the package substrate 100, and receive power from the package substrate 100. In this embodiment, a power voltage is applied to one electrode of the inductor 132 and a ground voltage is applied to one electrode of the capacitor 134. However, vice versa may be possible. The other of the both electrodes of the inductor 132 and the other of the both electrodes of the capacitor 134 may be connected to the package substrate 100, and electrically connected to each other through the package substrate 100.

In this embodiment, the inductor 132 and the capacitor 134 may be disposed at the other side of the memory controller 110 in the first direction. The inductor 132 and the capacitor 134 may be spaced apart from the memory controller by a distance. In this case, the power connection terminal 114 and the ground connection terminal 116 disposed at the other edge of the memory controller 110 in the first direction may be connected to the inductor 132 and the capacitor 134, respectively, and thus, a distance between the power connection terminal 114 and the inductor 132 and/or between the ground connection terminal 116 and the capacitor 134 may be reduced as much as possible. As described above, when the electrical connection path between the capacitor 134 and the memory controller 110 decreases, a shortage of power generated during the operation of the memory controller 110 may be more readily solved by the capacitor 134. However, the present disclosure is not limited thereto, and the arrangement and positions of the inductor 132 and the capacitor 134 may be variously modified.

In addition, in this embodiment, the inductor 132 and the capacitor 134 may be disposed at the other edge of the package substrate 100 in the first direction, so as not to overlap the memory chip 120. However, the present disclosure is not limited thereto, and at least a portion of the inductor 132 and/or at least a portion of the capacitor 134 may overlap the memory chip 120. That is, at least a portion of the inductor 132 and/or at least a portion of the capacitor 134 may be disposed in a space between the memory chip 120 and the package substrate 100.

The package substrate 100 may have a multilayer wiring structure. In this embodiment, the package substrate 100 may include four layers L1, L2, L3, and L4 at which horizontal wirings are formed. For convenience of description, the four layers L1, L2, L3, and L4 will be referred to as a first layer L1, a second layer L2, a third layer L3, and a fourth layer L4, respectively, according to a distance from the upper surface of the package substrate 100. In addition, the horizontal wirings formed at the first layer L1, the second layer L2, the third layer L3, and the fourth layer L4, respectively, will be referred to as a first horizontal wiring W1, a second horizontal wiring W2, a third horizontal wiring W3, and a fourth horizontal wiring W4. The upper or lower surface of the package substrate 100 and the horizontal wirings W1, W2, W3, and W4 may be connected to each other through vertical wirings. Hereinafter, a vertical wiring connecting the upper surface of the package substrate 100 and the first horizontal wiring W1 will be referred to as a first vertical wiring V1, a vertical wiring connecting the upper surface of the package substrate 100 and the second horizontal wiring W2 will be referred to as a second vertical wiring V2, a vertical wiring connecting the upper surface of the package substrate 100 and the third horizontal wiring W3 will be referred to as a third vertical wiring V3, and a vertical T0 wiring connecting the upper surface of the package substrate 100 and the fourth horizontal wiring W4 will be referred to as a fourth vertical wiring V4. In this embodiment, the third horizontal wiring W3 and the fourth horizontal wiring W4 may be used as power wiring that receives power from the outside. For this reason, a fifth vertical wiring V5 may be formed to connect the third horizontal wiring W3 and the lower surface of the package substrate 100 on which the external connection terminal 150 is disposed. In addition, a sixth vertical wiring V6 may be formed to connect the fourth horizontal wiring W4 and the lower surface of the package substrate 100 on which the external connection terminal 150 is disposed. The rest of the package substrate 100, except for the horizontal wirings W1, W2, W3, and W4, and the vertical wirings V1, V2, V3, V4, V5, and V6, may include an insulating material.

Hereinafter, referring to FIGS. 2 and 3, a ground voltage transmission path in the package substrate 100 will be described. In this embodiment, the wirings used for transmitting the ground voltage may be the fourth horizontal wiring W4, and the fourth and sixth vertical wirings V4 and V6 connected thereto. However, the present disclosure is not limited thereto, and any one of the first to third horizontal wiring W1, W2, and W3, and the vertical wirings connected thereto may be used to transmit the ground voltage.

The fourth horizontal wiring W4 may be electrically connected to the ground connection terminal 116 of the memory controller 110, TO the ground bonding pad 106 over the upper surface of the package substrate 100, and the one electrode of the inductor 132. As an example, the ground connection terminal 116 may be electrically connected to the fourth horizontal wiring W4 through the fourth vertical wiring V4 that overlaps and directly connects to the ground connection terminal 116. The ground bonding pad 106 may also be electrically connected to the fourth horizontal wiring W4 through the fourth vertical wiring V4 that overlaps and directly connects to the ground bonding pad 106. On the other hand, the one electrode of the inductor 132 may be electrically connected to the fourth horizontal wiring W4 through the first vertical wiring V1 that overlaps and directly connects to the one electrode of the inductor 132, the first horizontal wiring W1 that connects to the first vertical wiring V1 and extends to the fourth vertical wiring V4, and the fourth vertical wiring V4. However, the present disclosure is not limited thereto, the ground connection terminal 116, the ground bonding pad 106, and the one electrode of the inductor 132 may be electrically connected to the fourth vertical wiring V4, by an appropriate combination of the first to third vertical wirings V1, V2, and V3 and the first to third horizontal wirings W1, W2, and W3.

Meanwhile, in this cross-sectional view, the external connection terminal 150 should not be visible, but for convenience of description, a ground external connection terminal 156 to which the ground voltage is applied, among the external connection terminals 150, is illustrated together. The fourth horizontal wiring W4 may be electrically connected to the ground external connection terminal 156 through the sixth vertical wiring V6.

Accordingly, a ground voltage supply path that transmits the ground voltage to the ground connection terminal 116 and the ground bonding pad 106 through the ground external connection terminal 156, the sixth vertical wiring V6, the fourth horizontal wiring W4, and the fourth vertical wiring V4, may be formed. In addition, a ground voltage supply path that transmits the ground voltage to the one electrode of the inductor 132 through the ground external connection terminal 156, the sixth vertical wiring V6, the fourth horizontal wiring W4, the fourth vertical wiring V4, the first horizontal wiring W1, and the first vertical wiring V1, may be formed.

In a plan view, the above ground voltage supply path may have a line shape that is bent in various directions to interconnect the ground bonding pad 106, the ground connection terminal 116, the ground external connection terminal 156, and the one electrode of the inductor 132.

Next, referring to FIGS. 2 and 4, a power voltage transmission path in the package substrate 100 will be described. In this embodiment, the wirings used for transmitting the power voltage may be the third horizontal wiring W3, and the third and fifth vertical wirings V3 and V5 connected thereto. However, the present disclosure is not limited thereto, and any one of the first, second, and fourth horizontal wirings W1, W2, and W4, and vertical wirings connected thereto may be used to transmit the power voltage.

The third horizontal wiring W3 may be electrically connected to the power connection terminal 114 of the memory controller 110, the power bonding pad 104 over the upper surface of the package substrate 100, and the one electrode of the capacitor 134. As an example, the power connection terminal 114 may be electrically connected to the third horizontal wiring W3 through the third vertical wiring V3 that overlaps and directly connects to the power connection terminal 114. The power bonding pad 104 may also be electrically connected to the third horizontal wiring W3 through the third vertical wiring V3 that overlaps and directly connects to the power bonding pad 104. On the other hand, the one electrode of the capacitor 134 may be electrically connected to the third horizontal wiring W3 through the first vertical wiring V1 that overlaps and directly connects to the one electrode of the capacitor 134, the first horizontal wiring W1 that is connected to the first vertical wiring V1 and extends to the third vertical wiring V3, and the third vertical wiring V3. However, the present disclosure is not limited thereto, and the power connection terminal 114, the power bonding pad 104, and the one electrode of the capacitor 134 may be electrically connected to the third vertical wiring V3 by an appropriate combination of the first and second vertical wirings V1 and V2, and the first and second horizontal wirings W1 and W2.

Meanwhile, in this cross-sectional view, the external connection terminal 150 should not be seen, but for convenience of description, a power external connection terminal 154 to which the power voltage is applied, among the external connection terminals 150, is illustrated together. The third horizontal wiring W3 may be electrically connected to the power external connection terminal 154 through the fifth vertical wiring V5.

Accordingly, a power voltage supply path for transmitting the power voltage to the power connection terminal 114 and the power bonding pad 104 through the power external connection terminal 154, the fifth vertical wiring V5, the third horizontal wiring W3, and the third vertical wiring V3, may be formed. In addition, a power voltage supply path for transmitting the power voltage to the one electrode of the capacitor 134 through the power external connection terminal 154, the fifth vertical wiring V5, the third horizontal wiring W3, the third vertical wiring V3, the first horizontal wiring W1, and the first vertical wiring V1, may be formed.

In summary, the inductor 132 and the capacitor 134 connected in series are electrically connected between the power wirings (see V5, W3, V3, W1, and V1 of FIG. 4) and the ground wirings (see V6, W4, V4, W1, and V1 of FIG. 3).

In a plan view, the above power voltage supply path may have a line shape that is bent in various directions to interconnect the power bonding pad 104, the power connection terminal 114, the power external connection terminal 154, and the one electrode of the capacitor 134. In addition, the power voltage supply path may be spaced apart and separated from the ground voltage supply path described above.

Next, referring to FIGS. 2, 3, and 4, a connection path between the inductor 132 and the capacitor 134 in the package substrate 100 will be described. In this embodiment, the wirings used to connect the inductor 132 and the capacitor 134 may be the first horizontal wiring W1 and the first vertical wiring V1 connected thereto. However, the present disclosure is not limited thereto, and any one of the second to fourth horizontal wirings W2, W3, and W4, and vertical wirings connected thereto may be used to connect the inductor 132 and the capacitor 134.

The first horizontal wiring W1 may be electrically connected to the other electrode of the inductor 132 and the other electrode of the capacitor 134 through the first vertical wiring V1 that overlaps and directly connects to each of the other electrode of the inductor 132 and the other electrode of the capacitor 134. Because the first vertical wiring V1 and the first horizontal wiring W1 only serve to connect the inductor 132 and the capacitor 134, there is no need to connect to the external connection terminal 150, or the like.

Next, referring to FIGS. 2 and 5, a signal transmission path in the package substrate 100 will be described. In this embodiment, the wirings used to transmit signals between the memory controller 110 and the memory chip 120 may be the second horizontal wiring W2 and the second vertical wiring V2 connected thereto. However, the present disclosure is not limited thereto, and any one of the first, third, and fourth horizontal wirings W1, W3, and W4, and vertical wirings connected thereto may be used to transmit the signals.

The second horizontal wiring W2 may be electrically connected to the signal connection terminal 112 of the memory controller 110 and the signal bonding pad 102 over the upper surface of the package substrate 100. As an example, the signal connection terminal 112 may be electrically connected to the second horizontal wiring W2 through the second vertical wiring V2 that overlaps and directly connects to the signal connection terminal 112. The signal bonding pad 102 may also be electrically connected to the second horizontal wiring W2 through the second vertical wiring V2 that overlaps and directly connects to the signal bonding pad 102. However, the present disclosure is not limited thereto, and the signal connection terminal 112 and the signal bonding pad 102 may be electrically connected to the second vertical wiring V2 by an appropriate combination of the first vertical wiring V1 and the first horizontal wiring W1. Because the second vertical wiring V2 and the second horizontal wiring W2 only serve to connect the memory chip 120 and the memory controller 110, there is no need to connect to the external connection terminal 150, or the like.

According to the memory package described above, because the circuit of FIG. 1 is implemented, all effects obtained by the circuit of FIG. 1 can be obtained.

In addition, because the path connecting the inductor 132 and the capacitor 134 in the package substrate 100 is shortest by using the first horizontal wiring W1 and the first vertical wiring V1, an electrical connection thereof may be implemented smoothly.

In addition, because the path connecting the memory chip 120 and the memory controller 110 in the package substrate 100 is next shortest by using the second horizontal wiring W2 and the second vertical wiring V2, it may be possible to smoothly exchange signals between them.

Further, instead of directly connecting the one electrode of the inductor 132 and the one electrode of the capacitor 134 with the third and fourth vertical wirings V3 and V4, the one electrode of the inductor 132 and the one electrode of the capacitor 134 may be connected to the third and fourth vertical wirings V3 and V4 via the first vertical wiring V1 and the first horizontal wiring W1. The first horizontal wiring W1 connected to the one electrode of the inductor 132 may extend to the fourth vertical wiring V4 that is connected to the ground connection terminal 116 of the memory controller 110, The first horizontal wiring W1 connected to the one electrode of the capacitor 134 may extend to the third vertical wiring V3 that is connected to the power connection terminal 114 of the memory controller 110. In this case, the distance between the memory controller 110 and the inductor 132 and the electrical connection path between the memory controller 110 and the capacitor 134 may be reduced. As a result, the decoupling capacitor function of the capacitor 134 can be improved.

Figure 6:
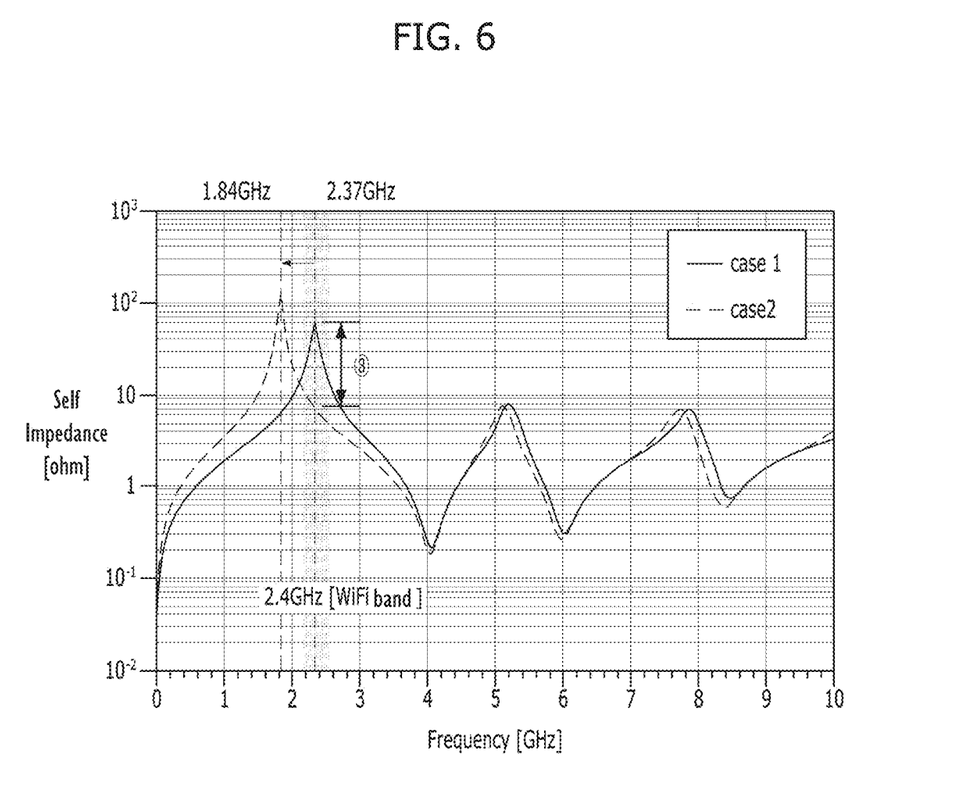
FIG. 6 is a diagram illustrating an effect of the memory package according to the present embodiment.

FIG. 6 is a diagram illustrating an effect of the memory package according to the present embodiment. In FIG. 6, a first case (case1) represents a case in which only a capacitor is formed between the memory controller 110 and the memory chip 120, and a second case (case2) represents a case in which the band pass filter 130 including the inductor 132 and the capacitor 134 which are connected in series is formed between the memory controller 110 and the memory chip 120.

Referring to FIG. 6, it can be seen that the impedance of the second case is reduced by reducing power noise in a specific frequency band, for example, a Wi-Fi band, compared to the first case.

Figure 7A:
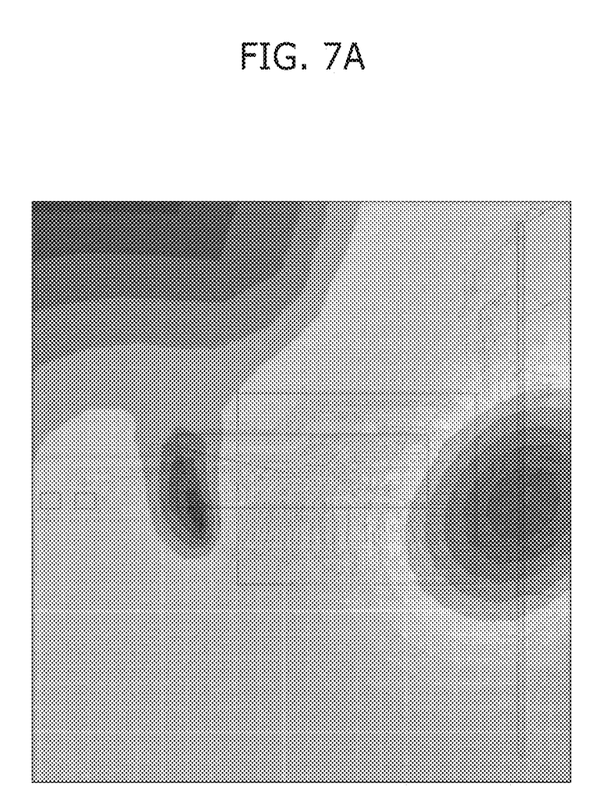
FIG. 7A is a diagram illustrating another effect of the memory package of the present embodiment.
Figure 7B:
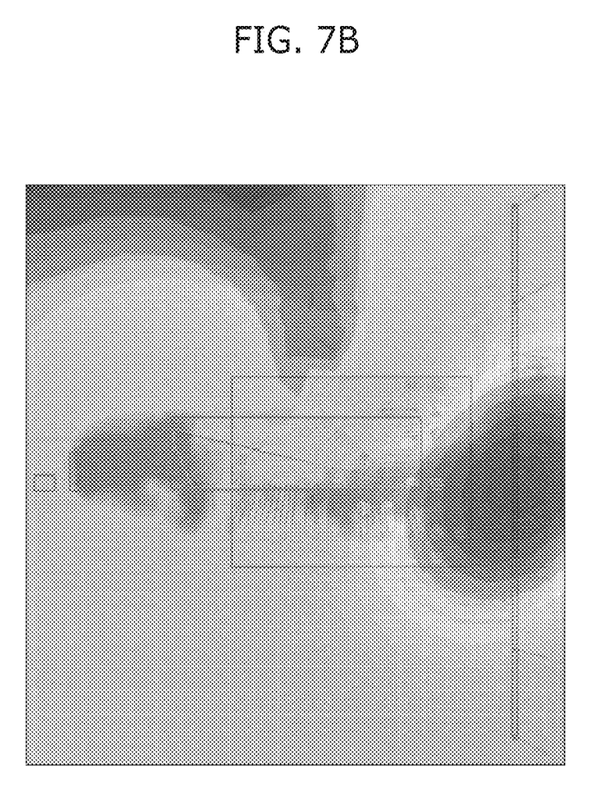
FIG. 7B is a diagram for comparison with FIG. 7A.

FIG. 7A is a diagram illustrating another effect of the memory package of the present embodiment, and FIG. 7B is a diagram for comparison with FIG. 7A. FIG. 7A shows a field strength indicating the degree of electromagnetic wave generation when the band pass filter 130 including the inductor 132 and the capacitor 134 which are connected in series is formed between the memory controller 110 and the memory chip 120. FIG. 7B is shows a field strength when only a capacitor is formed between the memory controller 110 and the memory chip 120.

Referring to FIG. 7A, it can be seen that the field strength is significantly reduced, compared to FIG. 7B. As a result, it can be seen that the degree of electromagnetic wave generation is reduced according to the memory package of this embodiment.

According to the embodiments of the disclosure, a memory package is provided which can shield the electromagnetic interference and ensure signal integrity by blocking/attenuating the power noise.

Figure 8:
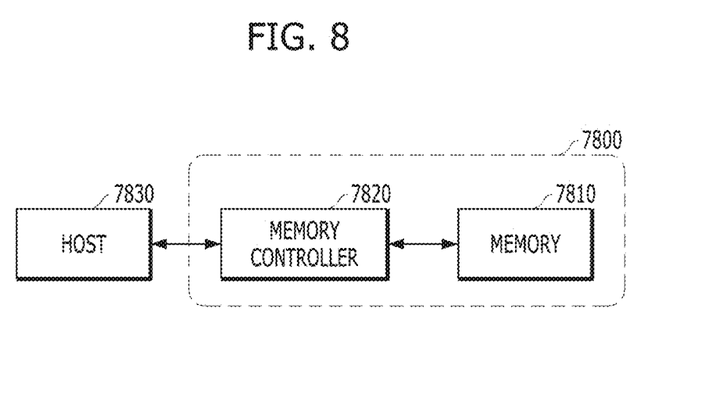
FIG. 8 shows a block diagram illustrating an electronic system employing a memory card including a semiconductor package, according to an embodiment.

FIG. 8 shows a block diagram illustrating an electronic system including a memory card 7800 employing at least one of the semiconductor packages according to the embodiments. The memory card 7800 includes a memory 7810, such as a nonvolatile memory device, and a memory controller 7820. The memory 7810 and the memory controller 7820 may store data or read out the stored data. At least one of the memory 7810 and the memory controller 7820 may include at least one of the semiconductor packages according to described embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 9:
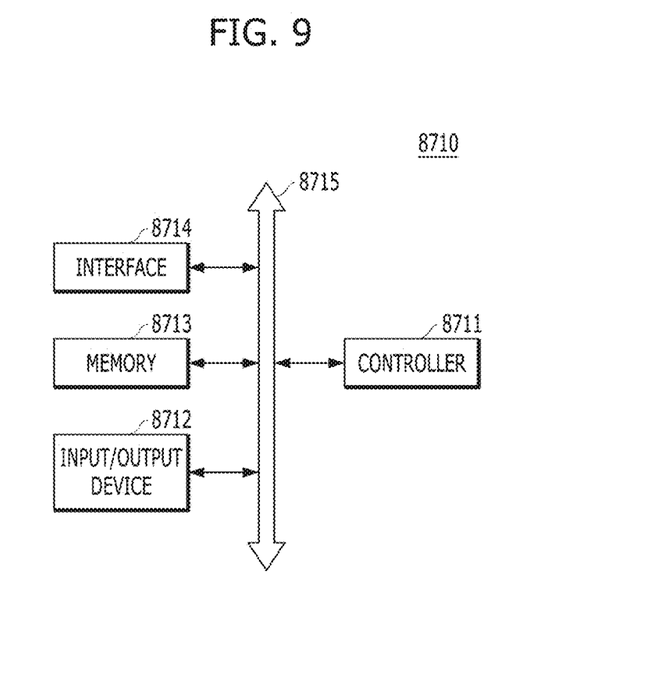
FIG. 9 shows a block diagram illustrating another electronic system including a semiconductor package, according to an embodiment.

FIG. 9 shows a block diagram illustrating an electronic system 8710 including at least one of the semiconductor packages according to described embodiments. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 represents equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution), or Wibro (wireless broadband Internet).

Although various embodiments have been described for illustrative purposes, it will be apparent to those skilled in the art that various changes and modifications may be made without departing from the spirit and scope of the disclosure as defined in the following claims.

What is claimed is:

1. A memory package, comprising:
a package substrate including power wiring and ground wiring;
a memory controller disposed over an upper surface of the package substrate and electrically connected to the power wiring and the ground wiring;
a memory chip disposed over the memory controller and electrically connected to the power wiring and the ground wiring; and
a band pass filter disposed at one side of the memory controller over the upper surface of the package substrate and including an inductor and a capacitor which are connected in series,
wherein each of the inductor and the capacitor includes one electrode and an other electrode, the one electrode of the inductor is electrically connected to one of the power wiring and the ground wiring, the one electrode of the capacitor is electrically connected to the other of the power wiring and the ground wiring,
wherein the other electrode of the inductor and the other electrode of the capacitor is electrically connected to each other by a connection wiring formed in the package substrate,
wherein the connection wiring, the power wiring, and the ground wiring have horizontal portions, respectively, and the horizontal portions are located at different layers parallel to the upper surface of the package substrate, and
wherein the horizontal portion of the connection wiring is closer to the upper surface of the package substrate than the horizontal portion of the power wiring and the ground wiring.

2. The memory package according to claim 1, wherein the package substrate further includes signal wiring for exchanging signals between the memory chip and the memory controller.

3. The memory package according to claim 2,
wherein the signal wiring has a horizontal portion which is located at a layer different from the horizontal portions of the connection wiring, the power wiring, and the ground wiring parallel to the upper surface of the package substrate; and
wherein the horizontal portion of the signal wiring is closer to the upper surface of the package substrate than the horizontal portions of the power wiring and the ground wiring.

4. The memory package according to claim 1,
wherein the memory controller includes a power connection terminal and a ground connection terminal formed on a lower surface of the memory controller;
wherein the power wiring includes vertical power wiring extending vertically downward from the power connection terminal and horizontal power wiring connected to the vertical power wiring; and
wherein the ground wiring includes vertical ground wiring extending vertically downward from the ground connection terminal and horizontal ground wiring connected to the vertical ground wiring.

5. The memory package according to claim 4, wherein the horizontal power wiring and the horizontal ground wiring are located at different layers in a vertical direction.

6. The memory package according to claim 4,
wherein the package substrate further includes vertical connection wiring connected to the one electrode of the inductor or the one electrode of the capacitor, and horizontal connection wiring extending from the vertical connection wiring to the vertical power wiring; and
wherein the horizontal connection wiring is closer to the upper surface of the package substrate than the horizontal power wiring.

7. The memory package according to claim 4,
wherein the package substrate further includes vertical connection wiring connected to the one electrode of the inductor or the one electrode of the capacitor, and horizontal connection wiring extending from the vertical connection wiring to the vertical ground wiring; and wherein the horizontal connection wiring is closer to the upper surface of the package substrate than the horizontal ground wiring.

8. The memory package according to claim 2,
wherein the signal wiring has a horizontal portion which is located at a layer different from the horizontal portions of the connection wiring, the power wiring, and the ground wiring parallel to the upper surface of the package substrate.

9. The memory package according to claim 8,
wherein the horizontal portion of the connection wiring is located closer to the upper surface of the package substrate than the horizontal portion of the signal wiring, the power wiring, and the ground wiring; and
wherein the horizontal portion of the signal wiring is located closer to the upper surface of the package substrate than the horizontal portion of the power wiring and the ground wiring.

10. The memory package according to claim 1, further comprising an external connection terminal formed over a lower surface of the package substrate and electrically connected to each of the power wiring and the ground wiring.

11. The memory package according to claim 1,
wherein the memory controller is connected to the package substrate through a connection terminal formed on a lower surface of the memory controller; and
wherein the memory chip is connected to the package substrate through a bonding wire.

12. The memory package according to claim 1, wherein the band pass filter is located outside the memory chip and the memory controller.

13. The memory package according to claim 1, wherein a planar area of the memory chip is larger than a planar area of the memory controller.

14. The memory package according to claim 13, wherein at least a portion of the band pass filter is located in a space between the memory chip and the package substrate.

15. The memory package according to claim 1,
wherein a connection path from the memory controller to the band pass filter through the power wiring is shorter than a connection path from the memory chip to the band pass filter through the power wiring; and
wherein a connection path from the memory controller to the band pass filter through the ground wiring is shorter than a connection path from the memory chip to the band pass filter through the ground wiring.

16. A memory package, comprising:
a package substrate including power wiring and ground wiring;
a memory controller disposed over an upper surface of the package substrate and electrically connected to the power wiring and the ground wiring;
a memory chip disposed over the memory controller and electrically connected to the power wiring and the ground wiring; and
a band pass filter disposed at one side of the memory controller over the upper surface of the package substrate and including an inductor and a capacitor which are connected in series,
wherein the inductor and the capacitor connected in series are electrically connected between the power wiring and the ground wiring,
the package substrate further includes signal wiring for exchanging signals between the memory chip and the memory controller,
the signal wiring, the power wiring, and the ground wiring have horizontal portions, respectively, and the horizontal portions are located at different layers parallel to the upper surface of the package substrate, and
the horizontal portion of the signal wiring is closer to the upper surface of the package substrate than the horizontal portion of the power wiring and the ground wiring.

* * * * *